United States Patent
Gulati et al.

(10) Patent No.: US 11,194,683 B2
(45) Date of Patent: *Dec. 7, 2021

(54) SELF-TEST DURING IDLE CYCLES FOR SHADER CORE OF GPU

(71) Applicant: QUALCOMM Incorporated, San Diego, CA (US)

(72) Inventors: Rahul Gulati, San Diego, CA (US); Andrew Evan Gruber, Arlington, MA (US); Brendon Lewis Johnson, San Diego, CA (US); Jay Chunsup Yun, Carlsbad, CA (US); Donghyun Kim, San Diego, CA (US); Alex Kwang Ho Jong, San Diego, CA (US); Anshuman Saxena, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 13 days.

This patent is subject to a terminal disclaimer.

(21) Appl. No.: 16/815,718

(22) Filed: Mar. 11, 2020

(65) Prior Publication Data

US 2020/0210299 A1    Jul. 2, 2020

Related U.S. Application Data

(63) Continuation of application No. 15/832,042, filed on Dec. 5, 2017, now Pat. No. 10,628,274.

(51) Int. Cl.
*G06F 11/00* (2006.01)
*G06F 11/22* (2006.01)
*G06F 11/07* (2006.01)
*G06T 15/00* (2011.01)
*G06T 1/20* (2006.01)
*G06F 11/277* (2006.01)
(Continued)

(52) U.S. Cl.
CPC ........ *G06F 11/2205* (2013.01); *G01R 31/317* (2013.01); *G01R 31/3187* (2013.01); *G06F 11/073* (2013.01); *G06F 11/2236* (2013.01); *G06F 11/277* (2013.01); *G06T 1/20* (2013.01); *G06T 15/005* (2013.01)

(58) Field of Classification Search
CPC ... G06F 11/2236; G06F 11/22; G06F 11/2227
See application file for complete search history.

(56) References Cited

U.S. PATENT DOCUMENTS 4,518,958 A    5/1985  Cook et al.
5,642,482 A    6/1997  Pardillos
(Continued)

OTHER PUBLICATIONS

International Search Report and Written Opinion—PCT/US2018/062872—ISA/EPO—dated Mar. 8, 2019, 15 pages.
(Continued)

*Primary Examiner* — Charles Ehne
(74) *Attorney, Agent, or Firm* — Shumaker & Sieffert, P.A.

(57) ABSTRACT

The disclosure describes techniques for a self-test of a graphics processing unit (GPU) independent of instructions from another processing device. The GPU may perform the self-test in response to a determination that the GPU enters an idle mode. The self-test may be based on information indicating a safety level, where the safety level indicates how many faults in circuits or memory blocks of the GPU need to be detected.

23 Claims, 5 Drawing Sheets

(51) Int. Cl.
    *G01R 31/3187*    (2006.01)
    *G01R 31/317*     (2006.01)

(56) References Cited

U.S. PATENT DOCUMENTS

| | | | |
|---|---|---|---|
| 8,276,123 | B1 | 9/2012 | Deng et al. |
| 10,146,893 | B1* | 12/2018 | Evans .................... G06F 30/20 |
| 10,467,723 | B2* | 11/2019 | Johnson .................... G06T 1/60 |
| 2012/0226942 | A1 | 9/2012 | Gangasani et al. |
| 2013/0007513 | A1 | 1/2013 | Traskov et al. |
| 2013/0024721 | A1 | 1/2013 | Kabulepa et al. |
| 2015/0070369 | A1 | 3/2015 | Frascati et al. |
| 2016/0328272 | A1 | 11/2016 | Ahmed et al. |
| 2016/0364308 | A1 | 12/2016 | Shanbhogue et al. |
| 2016/0379333 | A1 | 12/2016 | Krutsch et al. |
| 2017/0115346 | A1 | 4/2017 | Sonawane et al. |
| 2017/0116702 | A1 | 4/2017 | Viggers et al. |
| 2017/0206717 | A1 | 7/2017 | Kühnapfel |
| 2018/0074927 | A1* | 3/2018 | Mori ....................... G06F 11/27 |
| 2019/0171538 | A1 | 6/2019 | Gulati et al. |

OTHER PUBLICATIONS

Prosecution History for U.S. Appl. No. 15/832,042 dated from Jul. 11, 2019 through Mar. 13, 2020, 30 pages.

* cited by examiner

SELF-TEST DURING IDLE CYCLES FOR SHADER CORE OF GPU

This application is a continuation and claims the benefit of U.S. patent application Ser. No. 15/832,042, filed Dec. 5, 2017, the entire contents of which are incorporated herein by reference.

TECHNICAL FIELD

The disclosure relates to self-test of processing circuitry.

BACKGROUND

An automobile may include a display device that can provide information, data, images, videos, and the like to the driver of the vehicle. For example, the display device may display the video captured by the rear-view camera to assist the driver of the vehicle in safely reversing out of a parking space. Further, the display device may be part of, or operably coupled to, an automotive advanced driver assistance system (ADAS) such that the display device may also display blind spot warnings to alert the driver that there are vehicles situated at the driver's blind spot.

Graphics processing units (GPUs) are processing circuits configured to perform many operations in parallel and are useful for graphics operations that generate graphics data for display. GPUs are used in a variety of environments including automobiles. For instance, a GPU generates image content such as image content on the dashboard behind the steering wheel. The GPU includes a shader core, which is a programmable processor, on which shader programs execute as part of the process to generate image content.

SUMMARY

In general, this disclosure describes techniques for structural field test of graphics processing unit (GPU) cores and memories. Such tests may be referred to as in-field tests, examples of which include logic built in self-test (LBIST) and memory built in self-test (MBIST), which may be for safety critical automotive applications. In some examples, to perform in-field tests, the GPU may be configured to automatically (e.g., without instructions from another device) perform the self-test during operation (e.g., in-field) when the GPU enters an idle state. Furthermore, the GPU may be configured to selectively stop and restart the self-test if the self-test is not complete and the GPU needs to switch from the idle state to an active state.

In one example, the disclosure describes a method for self-test of a graphics processing unit (GPU), the method comprising determining, by the GPU, a safety level for operation of the GPU, determining an instance when the GPU enters an idle mode, and executing a self-test to determine whether the GPU is operating in accordance with the safety level in response to the GPU entering the idle mode.

In one example, the disclosure describes a device for self-test of a graphics processing unit (GPU), the device comprising a memory configured to store information for a self-test and the GPU. The GPU is configured to determine a safety level for operation of the GPU, determine an instance when the GPU enters an idle mode, and execute the self-test to determine whether the GPU is operating in accordance with the safety level in response to the GPU entering the idle mode.

In one example, the disclosure describes a computer-readable storage medium comprising instructions for self-test of a graphics processing unit (GPU) that when executed cause the GPU to determine a safety level for operation of the GPU, determine an instance when the GPU enters an idle mode, and execute a self-test to determine whether the GPU is operating in accordance with the safety level in response to the GPU entering the idle mode.

In one example, the disclosure describes a device for self-test of a graphics processing unit (GPU), the device comprising the GPU, wherein the GPU comprises means for determining a safety level for operation of the GPU, means for determining an instance when the GPU enters an idle mode, and means for executing a self-test to determine whether the GPU is operating in accordance with the safety level in response to the GPU entering the idle mode.

The details of one or more examples are set forth in the accompanying drawings and the description below. Other features, objects, and advantages will be apparent from the description, drawings, and claims.

DETAILED DESCRIPTION

Figure 1:
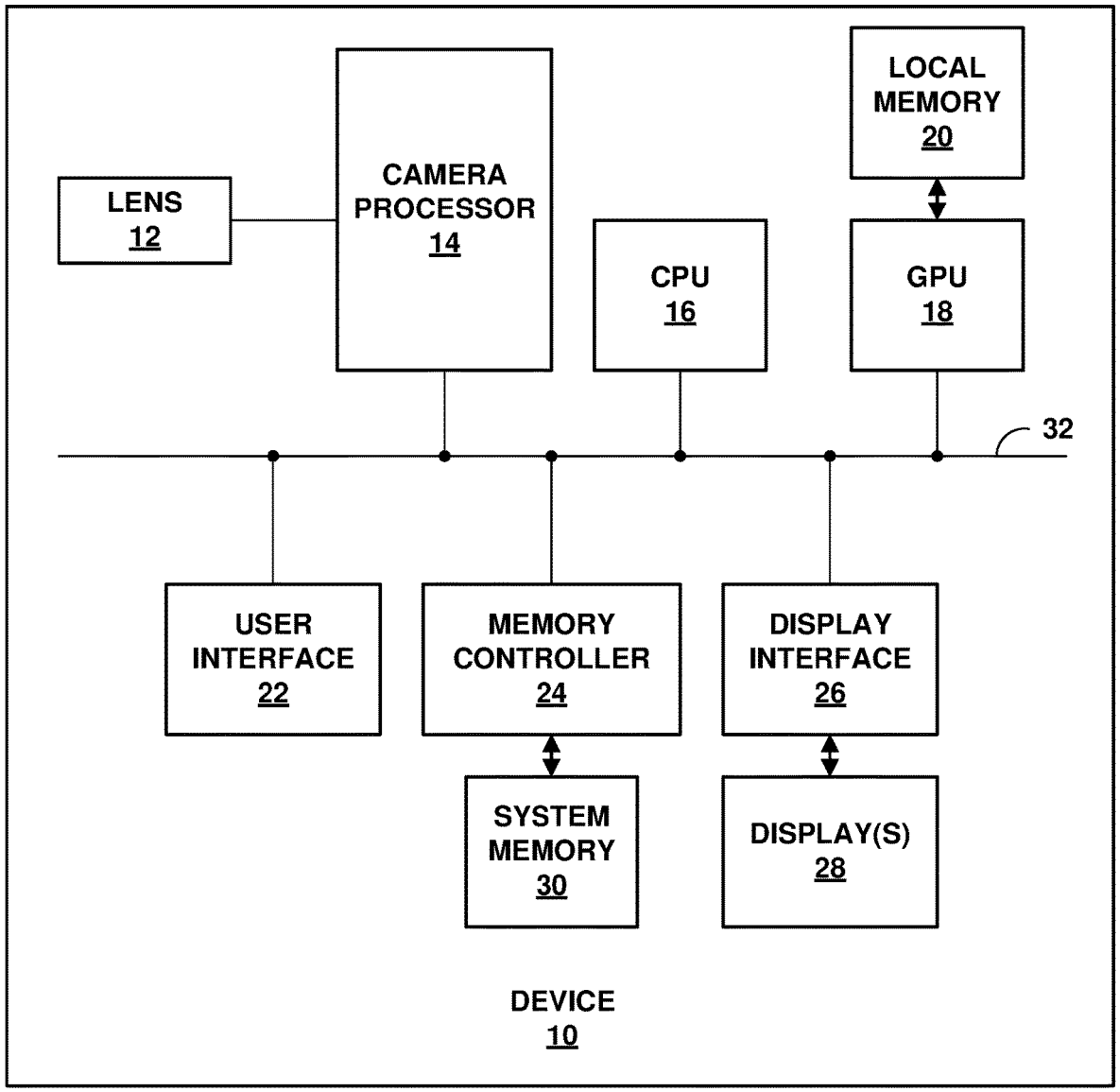
FIG. 1 is a block diagram of a device configured to perform one or more of the example techniques described in this disclosure.

Advanced driver assistance systems (ADAS) need to fulfill functional safety standard mandated by ISO 26262. One of the requirements of ISO 26262 is that hardware components be able to perform a self-test during operation to ensure integrity of the components. Examples of the self-test include tests on the logic (logic built in self-test (LBIST)) and on the memory (memory built in self-test (MBIST)). Examples of applications governed by ISO 26262 include instrument cluster display systems (e.g., graphical dashboard), overlays on captured image content, and the like.

In some examples, a GPU performs the graphics operations to generate the graphics content that is displayed for applications governed by safety standards in automotive cases. Therefore, the GPU is a hardware component that should comply with the self-test requirements of ISO 26262.

To ensure that the GPU is operating correctly, the GPU may perform concurrent and online testing of itself to detect operational faults that occur while the GPU processes an image or images for display by a display device. Concurrent testing of the GPU may be continuous testing while the device that includes the GPU, such as an automobile, is operational. Online testing may include testing while the automobile is powered on and performing its normal functionality. The GPU may perform testing while the GPU is powered on and in use without entering into a dedicated test mode, and without switching off the display device. Thus, if the GPU is an ADAS, the user of the ADAS may use the ADAS to, for example, view video streamed from a rearview camera of the vehicle while ADAS performs concurrent and online testing of the GPU.

Such concurrent and online testing may detect operational faults. Examples of the operational faults may include a blank screen, a frozen frame, or an incorrect display of data. Operational faults may include permanent faults, intermittent faults, and transient faults. Permanent faults may be faults that remain in existence indefinitely if no corrective action is taken. Such faults may be residual design or manufacturing faults. Intermittent faults may appear, disappear, and reappear repeatedly. Such faults may be difficult to predict but their effects may be highly correlated. When such intermittent faults appear, the GPU may work correctly most of the time but may fail under atypical environmental conditions. Transient faults may appear and disappear quickly, and such faults may not be correlated. Such transient faults are often induced by random environmental disturbances.

A GPU configured to perform the techniques of this disclosure may perform concurrent and online testing of itself to detect operational faults via a systematic testing methodology. The GPU may include mechanisms for performing concurrent and online built-in self-tests for several hardware sub-blocks during normal operation. The GPU may perform such built-in self-tests to detect whether the hardware sub-blocks in the GPU introduces any faults in the processing, and whether the faults are detected. As one example, the GPU may perform such built-in self-tests to determine whether a threshold percentage of faults in the sub-blocks in the GPU are detected. The GPU may be a part of a computing device, such as an ADAS, and the like, or may be a standalone module that may perform the built-in self-tests described throughout this disclosure.

Existing self-test techniques require a central processing unit (CPU) to execute software that controls the storage of current state information of the GPU so that the GPU can perform the self-test, and then return to its normal operation by reloading the state information. Additionally, the CPU and GPU perform handshaking operations to find an optimal time to perform the self-test. Relying on software to store state information and restore the GPU, and forcing handshaking between the CPU and GPU to find times to self-test results in complexity.

This disclosure describes example techniques for an automatic self-test of the GPU. Automatic self-test of the GPU may mean that the GPU performs the self-test independent of instructions form the GPU. As an example, the GPU may automatically perform a self-test without intervention from the CPU. A compiler compiles an application based on an instruction set architecture (ISA) of the GPU. In examples described in this disclosure, the ISA for the GPU provides instructions to define whether an application or portion of an application is safety critical. The ISA is usable for both safety and non-safety critical applications.

A developer developing the application may include a definition or instruction indicating that the application or portion of application is safety critical. One example of a portion of an application is a subset of the instructions of the application or certain functions called by the application during execution (e.g., shaders called by the application). The compiler may compile the instruction indicating that the application or portion of application is safety critical using the ISA instructions. As one example, the compiler may include a functional safety (FS) flag that indicates that a portion of the application is a safety critical or not safety critical portion of the application.

The GPU receives the compiled instructions for an application. The compiled instructions may indicate a safety level of the application or portion of the application (e.g., subset of instructions or shader called by the application). In examples described in this disclosure, when the GPU becomes idle (e.g., does not receive instructions for an extended period of time) during execution of the application or the portion of the application, if the compiled instructions indicate that the application or portion of the application is safety critical, the GPU may automatically perform a self-test. As an example, the GPU may perform the self-test independent of instructions from the CPU to perform the self-test. For instance, self-test independent of instructions from the CPU, may mean as an example, self-test without receiving instruction from the CPU to perform the self-test. In this way, the GPU is capable of performing a true self-test independent of self-test instructions from the CPU. Performing the self-test independent of self-test instructions from the CPU may reduce the complexity of CPU control.

In some examples, rather than the compiler including instructions that define the safety level, the developer may leverage the ISA instructions and include an instruction directly in the source code of the application that not only causes the GPU to go into an idle state, but also defines the safety level for the self-test. In such cases, the compiler still compiles the instruction that indicates the safety level.

Examples of the safety level include those defined by the automotive safety integrity level (ASIL). For instance, the ASIL defines both single point fault metrics and latent fault metrics. The single point fault metrics and the latent fault metrics define how many faults in circuits or memory blocks of the GPU need to be detected (e.g., at least 90%, 97%, or 99% of single point faults need to be detected, and/or at least 60%, 80%, and 90% of latent faults need to be detected). Single point faults and latent faults are described in more detail below.

Furthermore, in examples where the CPU controls the self-test performed by the GPU, the GPU may be unavailable to perform other operations because the CPU may pause the GPU from performing additional operations. For example, the CPU may not provide instructions to the GPU until the GPU completes the self-test. This may result in a delay of other tasks that are to be completed by the GPU.

In one or more example techniques, the GPU may be able to selectively execute instructions even when performing the self-test. For example, the self-test may be divided into slices, and the GPU may execute the slices as part of the self-test. Each slice includes a portion of operations of the self-test, and may be separable portions of the self-test in some examples, as will be described in more detail. In the event that the GPU receives instructions while executing the self-test, the GPU may pause the self-test in the middle of executing the self-test, and execute the received instructions. Upon completion of the execution of the received instructions, the GPU may re-execute the operations of the current slice, and continue executing the next slice of the self-test. In this manner, the GPU may selectively pause the execution of the self-test to allow for timely completion of other tasks given to the GPU.

FIG. 1 is a block diagram of a device configured to perform one or more of the example techniques described in this disclosure. One example of device 10 is an automobile. For ease of illustration and brevity, various components of an automobile are not shown or described. Rather, FIG. 1 illustrates the components for performing example techniques described in this disclosure.

Device 10 is not limited to an automobile. Other examples of device 10 include a computer (e.g., personal computer, a desktop computer, or a laptop computer), a mobile device such as a tablet computer, a wireless communication device (such as, e.g., a mobile telephone, a cellular telephone, a satellite telephone, and/or a mobile telephone handset), a landline telephone for teleconferencing, an Internet telephone, a handheld device such as a portable video game device or a personal digital assistant (PDA). Additional examples of computing device 10 include a personal music player, a video player, a display device, a camera, a television, a set-top box, a broadcast receiver device, a server, an intermediate network device, a mainframe computer or any other type of device that processes and/or displays graphical data. For purposes of description, the examples are described with respect to device 10 being an automobile with the understanding that the examples may be extended to other examples of device 10.

As illustrated in the example of FIG. 1, device 10 includes lens 12, camera processor 14, a central processing unit (CPU) 16, a graphical processing unit (GPU) 18 and local memory 20 of GPU 18, user interface 22, memory controller 24 that provides access to system memory 30, and display interface 26 that outputs signals that cause graphical data to be displayed on one or more displays 28. Bus 32 provides the interconnection of the various components.

Although the various components are illustrated as separate components, in some examples the components may be combined to form a system on chip (SoC). As an example, camera processor 14, CPU 16, GPU 18, and display interface 26 may be formed on a common integrated circuit (IC) chip. In some examples, one or more of camera processor 14, CPU 16, GPU 18, and display interface 26 may be in separate IC chips. Various other permutations and combinations are possible, and the techniques should not be considered limited to the example illustrated in FIG. 1.

The various components illustrated in FIG. 1 (whether formed on one device or different devices) may be formed as at least one of fixed-function or programmable circuitry such as in one or more microprocessors, application specific integrated circuits (ASICs), field programmable gate arrays (FPGAs), digital signal processors (DSPs), or other equivalent integrated or discrete logic circuitry. Examples of local memory 20 include one or more volatile or non-volatile memories or storage devices, such as, e.g., random access memory (RAM), static RAM (SRAM), dynamic RAM (DRAM), erasable programmable ROM (EPROM), electrically erasable programmable ROM (EEPROM), flash memory, a magnetic data media or an optical storage media.

The various units illustrated in FIG. 1 communicate with each other using bus 32. Bus 32 may be any of a variety of bus structures, such as a third-generation bus (e.g., a HyperTransport bus or an InfiniBand bus), a second-generation bus (e.g., an Advanced Graphics Port bus, a Peripheral Component Interconnect (PCI) Express bus, or an Advanced eXtensible Interface (AXI) bus) or another type of bus or device interconnect. It should be noted that the specific configuration of buses and communication interfaces between the different components shown in FIG. 1 is merely exemplary, and other configurations of computing devices and/or other image processing systems with the same or different components may be used to implement the techniques of this disclosure.

One or more displays 28 display pertinent information to the driver or passengers. Examples of one or more displays 28 include a monitor, a liquid crystal display (LCD), a plasma display panel, a light emitting diode (LED) array, a touch panel, and the like.

In some examples, there may be only one display 28 in device 10, such as one large screen that functions as user interface 22 as well as the "dashboard" that displays information such as speed, temperature, gas level, battery level, and other such information, and outputs images captured by camera processor 14. In some examples, there may be a plurality of displays 28. For instance, one of displays 28 may be the dashboard behind the steering wheel, another one of displays 28 may be the screen that shows information such as distance traveled, temperature settings, and the like.

There may be one GPU, like GPU 18, and one display interface, like display interface 26, associated with each one of displays 28, or there may be a single GPU 18 and single display interface 26 for each one of displays 28. In the examples described in this disclosure, there is one GPU 18 and one display interface 26 for each one of displays 28. However, the example techniques are applicable also to where there are multiple ones of GPU 18 and multiple ones of display interface 26.

User interface 22 is used in this disclosure to generically refer to ways in which a driver or passenger may interact with device 10. For instance, user interface 22 may be switches on the side of the steering wheel that the driver may use to cycle through radio stations. User interface 22 may be the gear stick that the driver uses to shift the car into gear or reverse. In some examples, user interface 22 may be part of one or more displays 28, such as in examples where one of displays 28 is a touch panel.

Camera processor 14, CPU 16, and GPU 18 may be configured to generate image content that one or more displays 28 display. For example, camera processor 14 is configured to receive electrical currents as sensor signals from respective pixels of lens 12 and process the electrical currents to generate pixel data of images. One example of lens 12 is the backup camera of an automobile. Camera processor 14 may be configured as a single-input-multiple-data (SIMD) architecture. Camera processor 14 may perform the same operations on current received from each of the sensors on each of lens 12. Each lane of the SIMD architecture may include an image pipeline. The image pipeline includes hardwire circuitry and/or programmable circuitry (e.g., at least one of fixed-function or programmable circuitry) to process the output of the sensors to generate pixel values for pixels to be in a displayed image.

For example, each image pipeline of camera processor 14 may include respective trans-impedance amplifiers (TIAs) to convert the current to a voltage and respective analog-to-digital converters (ADCs) that convert the analog voltage output into a digital value. The current outputted by each pixel indicates the intensity of a red, green, or blue component.

In addition to converting analog current outputs to digital values, camera processor 14 may perform some additional post-processing to increase the quality of the final image. For example, camera processor 14 may evaluate the color and brightness data of neighboring image pixels and perform demosaicing to update the color and brightness of the image pixel. Camera processor 14 may also perform noise reduction and image sharpening, as additional examples. Camera processor 14 outputs the resulting images (e.g., pixel values for each of the image pixels) to system memory 30 via memory controller 24.

CPU 16 may comprise a general-purpose or a special-purpose processor that controls operation of device 10. A user may provide input to device 10 to cause CPU 16 to execute one or more software applications. The software applications that execute on CPU 16 may include, for example, a graphical user interface application or another program. As an example, CPU 16 may execute one or more software applications that generate image content for icons shown on one or more displays 28. As another example, in response to the user placing the automobile in reverse, CPU 16 may execute an application that causes camera processor 14 to process the image content captured by lens 12. As another example, CPU 16 may execute an application that generates image content indicating the battery level, fuel level, temperature, etc.

The above example applications that CPU 16 executes are examples where CPU 16 generates image content for display. However, there may be other example applications that CPU 16 executes that do not generate image content such as the operating system. Furthermore, rather than executing applications to generate the image content, CPU 16 may be hardwired to generate the image content. For instance, rather than executing an application on programmable circuitry to determine the fuel level based on information received from a fuel sensor, CPU 16 may be hardwired to determine the fuel level with specialized fixed-function circuitry that receive information from the fuel sensor and outputs information indicating the fuel level. In some cases, even in such examples, CPU 16 may execute an application that receives the information indicating the fuel level from the fixed-function circuitry and generates graphical commands so that GPU 18 can generate image content showing the fuel level.

There may be various combinations and permutations of using fixed-function and programmable circuitry for CPU 16 to generate information that is to be displayed on one or more displays 28. The above provide some examples, and such examples should not be considered limiting.

The software applications that execute on CPU 16 may include one or more graphics rendering instructions that instruct GPU 18 to cause the rendering of graphics data for storage in system memory 30 and/or for display on display 28. In some examples, the software instructions may conform to a graphics application programming interface (API), such as, e.g., an Open Graphics Library (OpenGL®) API, an Open Graphics Library Embedded Systems (OpenGL ES) API, an OpenCL API, a Direct3D API, an X3D API, a RenderMan API, a WebGL API, or any other public or proprietary standard graphics API. The techniques should not be considered limited to requiring a particular API.

As one example, CPU 16 may determine the miles-per-gallon that the automobile is achieving, and generate graphics rendering instructions that instruct GPU 18 to generate image content showing the miles-per-gallon. As another example, the driver may be reversing the automobile, and in response, CPU 16 may cause one or more displays 28 to display image content captured by lens 12 (e.g., backup camera) and processed by camera processor 14. In addition, CPU 16 may determine an angle of movement of the automobile, and generate graphical information showing the path of the automobile in reverse. CPU 16 may generate graphics rendering instructions for GPU 18 to draw the path of the automobile that is superimposed on the images processed by camera processor 14. Accordingly, GPU 18 may be configured to generate image content for an automobile application while the automobile is in operation.

Memory controller 24 facilitates the transfer of data going into and out of system memory 30. For example, memory controller 24 may receive memory read and write commands, and service such commands with respect to memory 30 in order to provide memory services for the components in computing device 10. Memory controller 24 is communicatively coupled to system memory 30. Although memory controller 24 is illustrated in the example of device 10 of FIG. 1 as being a processing circuit that is separate from both CPU 16 and system memory 30, in other examples, some or all of the functionality of memory controller 24 may be implemented on one or both of CPU 16 and system memory 30.

System memory 30 may store program modules and/or instructions and/or data that are accessible by camera processor 14, CPU 16, and GPU 18. For example, system memory 30 may store user applications (e.g., instructions for the camera application), resulting images from camera processor 14 and GPU 18, etc. System memory 30 may additionally store information for use by and/or generated by other components of device 10. For example, system memory 30 may act as a device memory for camera processor 14. System memory 30 may include one or more volatile or non-volatile memories or storage devices, such as, for example, random access memory (RAM), static RAM (SRAM), dynamic RAM (DRAM), read-only memory (ROM), erasable programmable ROM (EPROM), electrically erasable programmable ROM (EEPROM), flash memory, a magnetic data media or an optical storage media.

In some examples, system memory 30 may include instructions that cause camera processor 14, CPU 16, GPU 18, and display interface 26 to perform the functions ascribed to these components in this disclosure. Accordingly, system memory 30 may be a computer-readable storage medium having instructions stored thereon that, when executed, cause one or more processors (e.g., camera processor 14, CPU 16, GPU 18, and display interface 26) to perform various functions.

In some examples, system memory 30 is a non-transitory storage medium. The term "non-transitory" indicates that the storage medium is not embodied in a carrier wave or a propagated signal. However, the term "non-transitory" should not be interpreted to mean that system memory 30 is non-movable or that its contents are static. As one example, system memory 30 may be removed from computing device 10, and moved to another device. As another example, memory, substantially similar to system memory 30, may be inserted into computing device 10. In certain examples, a non-transitory storage medium may store data that can, over time, change (e.g., in RAM).

Camera processor 14, CPU 16, and GPU 18 may store image data, and the like in respective buffers that are allocated within system memory 30. Display interface 26 may retrieve the data from system memory 30 and configure display 28 to display the image represented by the generated image data. In some examples, display interface 26 may include a digital-to-analog converter (DAC) that is configured to convert the digital values retrieved from system memory 30 into an analog signal consumable by display 28. In other examples, display interface 26 may pass the digital values directly to display 28 for processing.

Automobiles require a high-level of safety compliance, and the ISO 26262 is the functional safety standard for road vehicles. Part of the operations of GPU 18 may fall under the safety critical Advanced Driver Assistance Systems (ADAS). One of the ISO 26262 requirements for ADAS is ensuring integrity, typically through online (during operation) self-tests, for various hardware components involved in safety critical use cases, such as GPU 18.

This disclosure describes example techniques of structural field tests of hardware cores (such as the core of GPU 18) and memories such as local memory 20. The field tests may be performed while device 10 is in operation (e.g., while being driven). The tests may be referred to as in-field Logic Built in Self Test (LBIST) and Memory Built in Self Test (MBIST). The LBIST and MBIST may be useful to ensure that GPU 18 and local memory 20 are operational, without fault, for safety critical automotive applications such as ADAS, or applications like Instrument Cluster display systems, and surround view systems that use GPU 18. The techniques described in this disclosure may provide a systematic methodology to ensure integrity of logic of GPU 18 and local memory 20 on every system power up and during runtime while device 10 is in-the-field (e.g., while being driven).

For compliance with safety requirements, certain portions of GPU 18 may be pre-allocated as circuit blocks that are used for safety critical applications. Allocating circuit blocks for safety critical applications reduces the number of circuits that need to be tested to ensure compliance with safety requirements. However, reserving circuit blocks of GPU 18 for safety critical applications is not necessary in every example.

One example of the pre-allocation may be based on the manufacturing of GPU 18. For instance, during the manufacturing, certain circuits of GPU 18 may be tested more rigorously, and these portions may be pre-allocated for safety critical applications. As another example, some portions of GPU 18 may be pre-allocated for safety critical applications, and these portions may be tested more rigorously prior to use of GPU 18. In some cases, an operating system (OS) executing on CPU 16 or graphics driver executing on CPU 16 may allocate the circuit blocks of GPU 18 for safety critical applications. Other, non-safety critical applications, may not have access to these circuits. For instance, the OS or graphics driver may ensure that no instruction submitted to GPU 18 makes use of the allocated blocks for safety critical applications. Other ways in which to pre-allocate circuit blocks used for safety critical applications is possible, and the techniques are not limited to these specific examples.

Ensuring compliance with safety requirements usually involves causing GPU 18 to perform a self-test. One example of a self-test is for GPU 18 to process known input values in a specific way to generate output values. CPU 16 may then compare the generated output values with known output values (e.g., ideal output values that GPU 18 should generate based on the known input values). If CPU 16 determines that the generated output values are the same as the known output values, CPU 16 may determine that GPU 18 is compliant with one or more requirements of the safety requirements. For example, CPU 16 may determine that a sufficient number of faults of a total number of faults were detected. Other examples of self-test exist, and the techniques described in this disclosure are not limited to any specific self-test. Examples of the safety requirements, and corresponding self-tests, are described in more detail below with respect to Automotive Safety Integrity Level (ASIL).

In some techniques, CPU 16 transmits instructions to GPU 18 that causes GPU 18 to perform the self-test. However, GPU 18 may be in the process of performing operations. Accordingly, CPU 16 executes an application that causes GPU 18 to perform a context save before initiating a self-test on any logic, core, or local memory 20. Context save means that GPU 18 stores state information in system memory 30 that indicates information of values stored in the registers of GPU 18, a portion of software that GPU 18 was executing, and like. Once GPU 18 completes storing its state information, GPU 18 can perform the self-test. GPU 18 then performs the self-test, and CPU 16 determines whether there are any faults in the processing performed by GPU 18. After completing the self-test, the application restores GPU 18 to its pre-self-test state based on the stored contexts.

However, such CPU 16 controlled self-test techniques may have drawbacks in operation. As one example, there may be significant software complexity in context save and restore. For example, CPU 16 and GPU 18 may perform various handshakes to ensure that GPU 18 is in a state where context save and restore is possible (e.g., GPU 18 may be performing operations that cannot be paused). As noted above, relying on software to store state information and restore GPU 18, and forcing handshaking between CPU 16 and GPU 18 to find times for GPU 18 to perform the self-test results in a complex way in which to perform the LBIST or MBIST.

Furthermore, during the execution of the self-test, GPU 18 may be otherwise unavailable. As an example, CPU 16 may output instructions to GPU 18 that cause GPU 18 to perform the self-test. During that time, CPU 16 may not output any additional commands to GPU 18 allowing GPU 18 to complete the self-test. While GPU 18 may complete its self-test, other tasks of GPU 18 may be delayed for the completion of the self-test, which may be undesirable.

This disclosure describes example techniques for GPU 18 to perform the self-test independent of control from CPU 16 (e.g., without control from CPU 16). For instance, rather than requiring CPU 16 to instruct GPU 18 to perform a self-test, GPU 18 may perform the self-test when GPU 18 is in an idle state (e.g., state where GPU 18 is not processing instructions). In such an example, rather than using a software application to perform a context save and restore, GPU 18 may automatically perform the save and restore.

In some examples, while GPU 18 is performing the self-test, GPU 18 may receive instructions from CPU 16 to perform some operations. GPU 18 may pause the execution of the self-test, execute the received instructions, and then re-start the self-test. For example, the self-test may be divided into a plurality of slices, where start or end of each slice is identified by a checkpoint.

Each slice includes a portion of operations of the self-test. For example, assume that the self-test includes a plurality of operations that GPU 18 is to perform to complete the self-test. One slice includes a portion, or subset, of the operations. In this way, the self-test includes a plurality of slices, with each slice including a portion of the operations of the plurality of operations of the self-test.

GPU 18 may execute each of the slices for executing the self-test. In the event that GPU 18 receives an instruction during the execution of a particular slice of the self-test, GPU 18 may stop execution of the particular slice, and execute the received instruction. Then, GPU 18 may restart execution of the particular slice, and move to the next slice. In some examples, rather than stopping execution of the particular slice, GPU 18 may first complete the execution of the particular slice, and then execute the received instruction, and then proceed with executing the next slice.

In this way, CPU 16 may be disassociated with the self-test that GPU 18 performs. For instance, CPU 16 may not control when GPU 18 performs the self-test, may not configure GPU 18 to perform the self-test, and may not pause GPU 18 from performing other tasks when performing the self-test. From the perspective of CPU 16, there may be no change in the operation of GPU 18 including when GPU 18 is performing the self-test.

The example techniques to perform the self-test may address one or more of the drawbacks described above because the use of complex software to control the context save and restore is not needed. Rather, GPU 18 is configured to perform the self-test during times when GPU 18 is not performing other tasks (e.g., during an idle state), and can store the contexts using hardware units that do not need to respond to software commands from CPU 16. Furthermore, by being able to selectively pause the self-test to allow other instructions to execute, the example techniques promote timely completion of tasks assigned to GPU 18.

Figure 2:
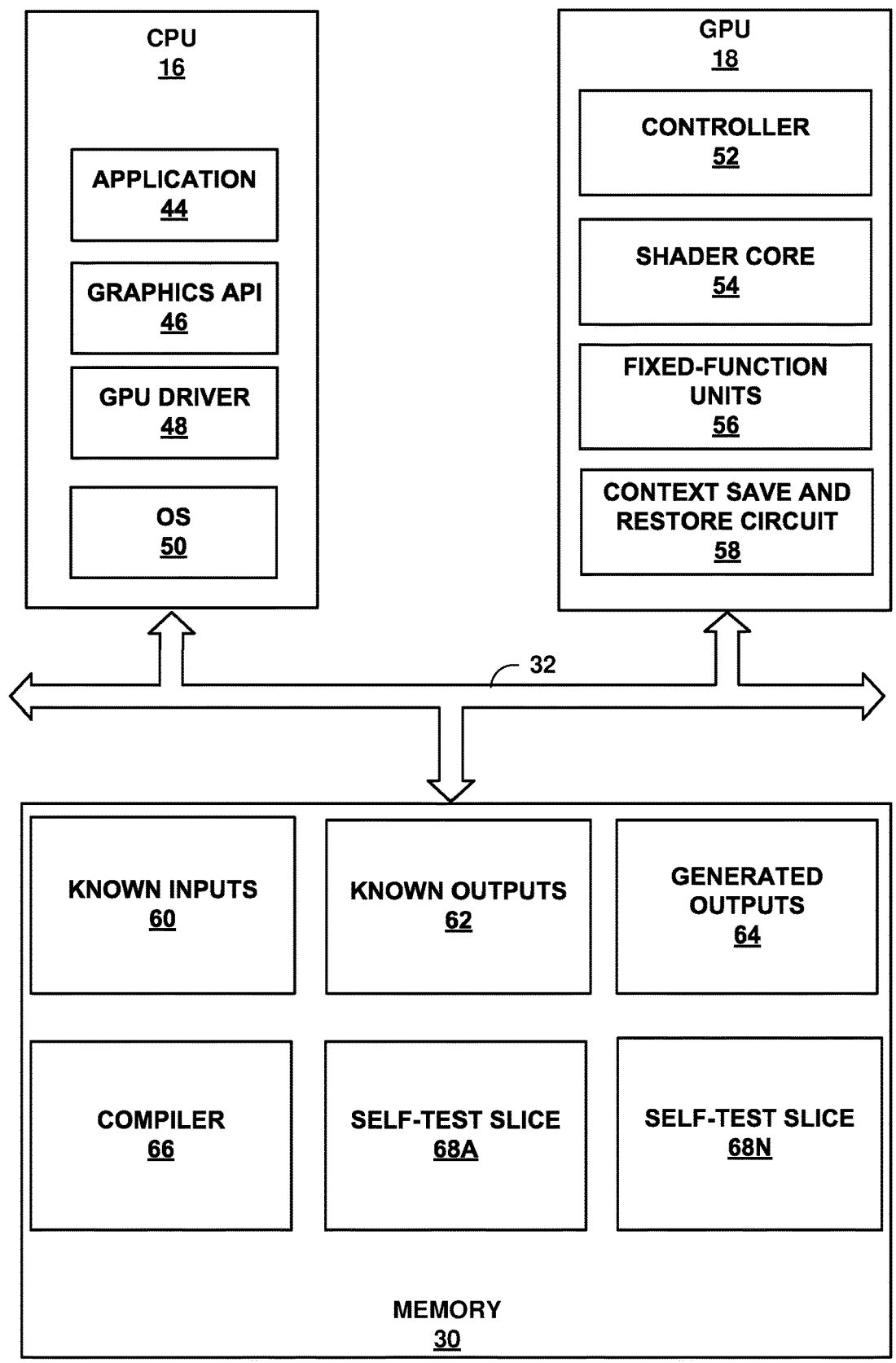
FIG. 2 is a block diagram illustrating a CPU, a GPU and a memory of the computing device of FIG. 1 in further detail.

FIG. 2 is a block diagram illustrating a CPU, a GPU and a memory of the computing device of FIG. 1 in further detail. As shown in FIG. 2, CPU 16 is communicatively coupled to GPU 18 and memory 30, and GPU 18 is communicatively coupled to CPU 16 and memory 30. GPU 18 may, in some examples, be integrated onto a motherboard with CPU 16. In additional examples, GPU 18 may be implemented on a graphics card that is installed in a port of a motherboard that includes CPU 16. In further examples, GPU 18 may be incorporated within a peripheral device that is configured to interoperate with CPU 16. In additional examples, GPU 18 may be located on the same microchip as CPU 16 forming a system on a chip (SoC).

CPU 16 is configured to execute software application 44, a graphics API 46, a GPU driver 48, and an operating system (OS) 50. GPU 18 includes a controller 52, shader core 54, and one or more fixed-function units 56. As illustrated, GPU 18 also includes context save and restore circuit 58. Context save and restore circuit 58 may be considered part of fixed-function units 56, but is illustrated separately for ease of description.

Software application 44 may include at least some of one or more instructions that cause graphic content to be displayed or one or more instructions that cause a non-graphics task (e.g., a general-purpose computing task) to be performed on GPU 18. As an example, software application 44 may cause CPU 16 to determine the movement of the automobile and generate graphics data showing the path of the automobile for GPU 18 to render. For instance, GPU 18 may be configured to generate image content for an automobile application while the automobile is in operation.

Software application 44 may issue instructions to graphics API 46. Graphics API 46 may be a runtime service that translates the instructions received from software application 44 into a format that is consumable by GPU driver 48. In some examples, graphics API 46 and GPU driver 48 may be part of the same software service.

GPU driver 48 receives the instructions from software application 44, via graphics API 46, and controls the operation of GPU 18 to service the instructions. For example, GPU driver 48 may formulate one or more command streams, place the command streams into memory 30, and instruct GPU 18 to execute command streams. GPU driver 48 may place the command streams into memory 30 and communicate with GPU 18 via operating system 50 (e.g., via one or more system calls).

Controller 52 of GPU 18 is configured to retrieve the commands stored in the command streams, and dispatch the commands for execution on shader core 54 and one or more fixed-function units 56. Controller 52 may dispatch commands from a command stream for execution on one or more fixed-function units 56 or a subset of shader core 54 and one or more fixed-function units 56. Controller 52 may be hardware, fixed-function circuitry of GPU 18, may be programmable circuitry of GPU 18 for executing software or firmware, or a combination of both.

Shader core 54 includes programmable circuitry (e.g., processing cores on which software executes). One or more fixed-function units 56 include fixed function circuitry configured to perform limited operations with minimal functional flexibility. Shader core 54 and one or more fixed-function units 56 together form a graphics pipeline configured to perform graphics processing.

Shader core 54 may be configured to execute one or more shader programs that are downloaded onto GPU 18 from CPU 16. A shader program, in some examples, may be a compiled version of a program written in a high-level shading language (e.g., an OpenGL Shading Language (GLSL), a High Level Shading Language (HLSL), a C for Graphics (Cg) shading language, etc.). In some examples, shader core 54 may include a plurality of processing units that are configured to operate in parallel (e.g., a SIMD pipeline). Shader core 54 may have a program memory that stores shader program instructions and an execution state register (e.g., a program counter register) that indicates the current instruction in the program memory being executed or the next instruction to be fetched. Examples of shader programs that execute on shader core 54 include, for example, vertex shaders, pixel shaders (also referred to as fragment shaders), geometry shaders, hull shaders, domain shaders, compute shaders, and/or unified shaders.

Fixed-function units 56 may include hardware that is hard-wired to perform certain functions. Although the fixed function hardware may be configurable, via one or more control signals, for example, to perform different functions, the fixed function hardware typically does not include a program memory that is capable of receiving user-compiled programs. In some examples, one or more fixed-function units 56 may include, for example, processing units that perform raster operations (e.g., depth testing, scissors testing, alpha blending, etc.).

GPU driver 48 of CPU 16 may be configured to write the command streams to memory 30, and controller 52 of GPU 18 may be configured to read the one or more commands of command streams from memory 30. In some examples, one or both of command streams may be stored as a ring buffer in memory 30. A ring buffer may be a buffer with a circular addressing scheme where CPU 16 and GPU 18 maintain synchronized state variables associated with the writing of data to and reading of data from the ring buffer. For example, if the first command stream is a ring buffer, each of CPU 16 and GPU 18 may store a write pointer indicating the next address to be written to in the ring buffer, and a read pointer indicating the next address to be read from in the ring buffer.

When CPU 16 writes a new command to the ring buffer (not shown), CPU 16 may update the write pointer in CPU 16 and instruct GPU 18 to update the write pointer in GPU 18. Similarly, when GPU 18 reads a new command from the ring buffer, GPU 18 may update the read pointer in GPU 18 and instruct CPU 16 to update the read pointer in CPU 16. Other synchronization mechanisms are possible. When the read and/or write pointers reach a highest address in the range of addresses allocated for the ring buffer, the read and/or write pointers may wrap around to the lowest address to implement a circular addressing scheme.

Example operation of an example GPU driver 48 and an example GPU controller 52 is now described with respect to FIG. 2. GPU driver 48 receives one or more instructions from software application 44 that specify graphics operations and/or general-purpose computing operations to be performed by GPU 18. GPU driver 48 places the output command stream into memory 30, which is accessible by GPU controller 52. GPU driver 48 notifies GPU controller 52 that the command stream corresponding to software application 44 is available for processing. For example, GPU driver 48 may write to a GPU register (e.g., a GPU hardware register polled by GPU 18 and/or a GPU memory-mapped register polled by GPU 18) one or more values indicating that the command stream is ready for execution.

Upon notification that the command stream is ready for execution, controller 52 of GPU 18 may determine if resources are currently available on GPU 18 to begin executing the command stream. If resources are available, controller 52 begins to dispatch the commands in the command stream.

As part of graphics processing, CPU 16 may offload certain graphics processing tasks to GPU 18. For instance, application 44 may generate attribute data for attributes of a plurality of vertices of primitives that interconnect to form a graphical object. Application 44 may store the attribute data in a vertex buffer in memory 30. GPU driver 48 may instruct controller 52 to retrieve the attribute data for the attributes of the vertices for processing to generate graphics data for display.

As described above, shader core 54 of GPU 18 may be configured to execute one or more shaders. To execute a shader, CPU 16 may retrieve the source code of the shader (e.g., vertex shader, fragment shader, compute shader, etc.) from system memory 30, and execute compiler 66 to generate object code of the shader. CPU 16 may store the object code of the shader in system memory 30, and shader core 54 may execute the object code of the shader to execute a shader.

As an example, the developer of application 44 may include instructions in application 44 that instruct CPU 16 to cause GPU 18 to execute one or more shaders called out by application 44 (e.g., the developer may bind one or more shaders to application 44). During execution of application 44 (e.g., during runtime), in response to instructions for GPU 18 to execute a shader, CPU 16 may execute compiler 66 to generate the object code of the shader, and shader core 54 may then execute the object code.

In some examples, compiler 66 may be configured to include information into instructions that GPU 18 is to process. The instructions indicate whether the shader is for a safety-critical application. GPU 18 may, based on the information, perform a self-test during a time when GPU 18 becomes idle. Example ways in which GPU 18 determines that it is idle will be described in more detail.

As one example, during compiling of a shader, compiler 66 may include information that indicates an automotive safety integrity level (ASIL). The ASIL defines various safety requirements. There is ASIL A, ASIL B, ASIL C, and ASIL D, where ASIL D includes the highest safety requirements and ASIL A includes the lowest safety requirements. ASIL includes a requirement for single point faults metric (SPFM) and latent faults metric (LFM). The SPFM is a metric for signal point faults. A single point fault means a fault in an element (e.g., circuit or memory block of GPU 18) that is not covered by any safety mechanism and that leads directly to the violation of a safety goal. The LFM is a metric for latent faults. A latent fault is a multiple point fault (e.g., two or more faults) whose presence is not detected by a safety mechanism nor perceived by the driver.

The SPFM for each ASIL defines how many single point faults need to be detected to be compliant with a particular ASIL. As one example, the SPFM for each ASIL may define that X % of single point faults need to be detected, where X is different for each ASIL. The LFM for each ASIL defines how many latent faults need to be detected to be compliant with a particular ASIL. As one example, the LFM for each ASIL may define that Y % of latent faults need to be detected, where Y is different for each ASIL.

As one example, ASIL B requires a diagnostic coverage of greater than or equal to 90% for the single point faults metric, and greater than or equal to 60% for the latent faults metric. This means that for circuit or memory blocks of GPU 18 that may be used for safety-critical applications, at least 90% of single point faults are detected and at least 60% of latent faults are detected to be compliant with the requirements of ASIL B. ASIL C requires a diagnostic coverage of greater than or equal to 97% for the single point faults metric, and greater than or equal to 80% for the latent faults metric. This means that for circuit or memory blocks of GPU 18 that may be used for safety-critical applications, at least 97% of single point faults are detected and at least 80% of latent faults are detected to be compliant with the requirements of ASIL C. ASIL D requires a diagnostic coverage of greater than or equal to 99% for the single point faults metric, and greater than or equal to 90% for the latent faults metric. This means that for circuit or memory blocks of GPU 18 that may be used for safety-critical applications, at least 99% single point faults are detected and at least 90% of latent faults are detected.

One example of a single point fault is where a memory block of GPU 18 is not protected with parity or error correction code (ECC), or another safety mechanism. In this case, a fault in that memory block would go undetected and could lead directly to a safety goal violation. Accordingly, for ASIL B, as one example, there should be a safety mechanism for a safety critical memory and that safety mechanism should provide diagnostic coverage of 90%, meaning that the safety mechanism should be able to detect at least 90% of the faults in the memory.

One example of a latent fault (e.g., two or more point faults) is where there is a fault in an element (e.g., circuit or memory block of GPU 18) and fault in safety mechanism for the element. In some, but not all examples, fault in an element and fault in its safety mechanism may be the only type of latent fault that needs to be detected. Assume that a safety critical memory of GPU 18 is protected with ECC. Also, assume that there is a fault in the ECC logic, which could be permanent hardware failure like as stuck-at-zero fault in the ECC logic. In this example, when a fault in memory occurs (e.g., a bit filp), then the ECC logic may not be able to correct or detect this fault because the ECC logic is already faulty. Accordingly, a test of the ECC logic itself may be part of meeting the ASIL requirements for the LFM. Such test may be performed at power up or periodically during runtime.

As described above, compiler 66 may include information that indicates an ASIL. The information indicating the ASIL may be multiple bits representing the different possible ASILs. The information may be a functional safety (FS) flag that indicates whether the shader is for a safety-critical application, and if the FS flag is true (e.g., a logic one), the flag is followed by a two-bit value, each two-bit value representing one of the four ASILs.

For instance, application 44 may be a safety-critical application, and therefore, during the development of application 44, the developer may include information or instructions that indicate that application 44 is safety-critical and may also include information indicating the ASIL. During compiling, compiler 66 may use the ASIL assigned to application 44 to determine whether to set the safety-critical FS flag true and determine the two-bit value needed to indicate the specified ASIL.

CPU 16 may then instruct GPU 18 to execute the shader (e.g., the object code of the shader). Shader core 54 may then begin executing the shader. Upon receiving the instructions indicating the specified ASIL, controller 52 may wait until GPU 18 is idle, and may then perform the self-test that corresponds to the specified ASIL, described in more detail.

The above example of using an FS flag to indicate whether an application is safety critical followed by a two-bit value to indicate the ASIL with which shader core 54 needs to be compliant is merely one example technique. Because ASIL D is the most stringent requirement, then GPU 18 being compliant with ASIL D means that GPU 18 is compliant with ASILs A, B, and C. In some examples, only an FS flag indicating whether an application is safety critical may be used. For example, if the FS flag indicates that an application is safety critical, then controller 52 may determine that when GPU 18 is idle, controller 52 should determine whether GPU 18 is compliant with ASIL D. Other possible ways to test whether GPU 18 is compliant with an ASIL are possible and the techniques should not be considered limited to the above examples.

In this manner, GPU 18 (e.g., via controller 52) may determine a safety level for operation of GPU 18. As one example, GPU 18 receive instructions that indicate the safety level as a way to determine the safety level for operation of GPU 18. There may be other ways in which GPU 18 may determine the safety level for operation of GPU 18 such as based on flags set in registers. As another example, information from where the instructions of the shader or application 44 are to be retrieved may be indicative of the safety level. For instance, certain locations of memory 30 may be reserved for safety-critical applications. If GPU 18 retrieves instructions for the shader called by application 44 or for instructions of application 44 from these locations of memory 30, GPU 18 may determine the safety level based on GPU 18 retrieving the instructions from these locations of memory 30 reserved for safety-critical applications.

The instructions that controller 52 is able to parse and shader core 54 is able to execute may be defined by an instruction set architecture (ISA). The ISA generally defines operations that processing circuitry can parse and execute. In some examples, the ISA is a form of machine-language instructions that are specific to the processing circuitry. GPU 18 may have its own ISA that compiler 66 leverages to include the flags and ASIL information into the instructions that controller 52 receives and processes (e.g., parses) and dispatches to shader core 54 for execution.

In one or more examples, the ISA for GPU 18 may be ASIL aware so that compiler 66 can include instructions that indicate the ASIL for compliance. The ASIL aware instructions may be included on top of the ISA that is available for non-safety critical applications. For example, compiler 66 may generate instructions for GPU 18 to indicate the safety level (e.g., ASIL) based on an ISA. The ISA may be the same for safety and non-safety critical applications. In this way, the ISA may provide mixed criticality support so that applications with varying ASILs can be executed using the same system-on-chip (SoC) that includes GPU 18.

As described above, controller 52 may perform a self-test based on the specified ASIL in response to GPU 18 entering the idle mode. There may be various ways in which controller 52 may determine an instance when GPU 18 enters an idle mode. As one example, controller 52 may monitor the instruction buffer in local memory 20. If there are no more instructions in the instruction buffer, controller 52 may determine an instance when GPU 18 enters an idle mode. As another example, controller 52 may track the clock frequency of GPU 18, and if the clock frequency drops below a certain level, controller 52 may determine an instance when GPU 18 enters an idle mode. Idle mode is generally referred to as a mode in which GPU 18 does not actively perform operations, and the techniques are applicable to the various example ways in which controller 52 determines whether GPU 18 is in idle mode.

In some examples, CPU 16 may output instructions that instruct GPU 18 to go into idle mode. For instance, application 44 may include an "idle" command or OS 50 may generate an "idle" command based on determination of resources needed. Controller 52 may determine that GPU 18 is in the idle mode based on the "idle" instruction. However, in accordance with one or more examples described in this disclosure, in response to receiving the "idle" instruction, controller 52 may convert the "idle" instruction to include an instruction for performing the self-test that ensures compliance with the safety level (e.g., circuit or memory blocks of GPU 18 are operating in accordance with the ASIL safety level).

As an example, assume that asm ("idle") represents the "idle" instruction where "asm" stands for assembly language. In some examples, controller 52 may process asm ("idle") as asm("idle_spfm_a") and asm ("idle_lfm_a") for ASIL A, where idle_spfm_a refers to single point faults metrics for ASIL A and idle_lfm_a refers to latent faults metric for ASIL A. Controller 52 may process asm("idle") as asm("idle_spfm_b") and asm ("idle_lfm_b") for ASIL B, where idle_spfm_b refers to single point faults metrics for ASIL B and idle_lfm_b refers to latent faults metric for ASIL B. Controller 52 may process asm("idle") as asm ("idle_spfm_c") and asm ("idle_lfm_c") for ASIL C, where idle_spfm_c refers to single point faults metrics for ASIL C and idle_lfm_c refers to latent faults metric for ASIL C. Controller 52 may process asm("idle") as asm ("idle_spfm_d") and asm ("idle_lfm_d") for ASIL D, where idle_spfm_d refers to single point faults metrics for ASIL D and idle_lfm_d refers to latent faults metric for ASIL D.

To begin a self-test, GPU 18 may store its current context state into system memory 30. By storing its current content state into system memory 30, GPU 18 is able to restart the operations GPU18 was performing prior to the self-test. The context of GPU 18 generally refers to one or more of internal registers of GPU 18, depth buffer content (such as in local memory 20), frame buffer content, and the like. In some existing techniques, CPU 16 executes an application that stores the contexts of GPU 18, or GPU 18 may execute an application that stores the contexts. However, as described above, such application driven context storage may not be efficient. Moreover, because CPU 16 is disassociated with GPU 18 when GPU 18 performs a self-test in one or more examples described in this disclosure, CPU 16 may not even be aware when GPU 18 is about to perform the self-test. Therefore, CPU 16 may not be able to timely execute the application for storing the contexts of GPU 18.

As illustrated in FIG. 2, GPU 18 includes context save and restore circuit 58. Context save and restore circuit 58 may be hardwire circuitry that stores contexts of GPU 18 prior to the self-test and restores the context of GPU 18 subsequent to self-test. Context save and restore circuit 58 may store the values of internal registers, depth buffer, frame buffer and the like into system memory 30, and retrieve the values from system memory 30 for restoring GPU 18.

In some examples, context save and restore circuit 58 may store the contexts independent of instructions from CPU 16 to store the contexts (e.g., automatically store the contexts without any instructions from CPU 16 to store the contexts).

In other words, context save and restore circuit 58 is responsible for saving any necessary state and restoring it on exit from the self-test independent of CPU 16. No software context save and restore process may be needed.

Once controller 52 determines that GPU 18 enters the idle mode, controller 52 may perform the self-test. The self-test may be a concurrent test that continuously checks, after execution of the self-test, for errors in the circuitry of GPU 18 or local memory 20 due to faults, which may be permanent, intermittent, and/or transient. The operational faults are usually classified by their duration. Permanent faults remain in existence indefinitely if no corrective action is taken, and many are residual, design, or manufacturing faults. Intermittent faults appear, disappear, and reappear repeatedly. They are difficult to predict, but their effects are highly correlated. When intermittent faults are present, GPU 18 works well most of time but fails under atypical environmental conditions. Transient faults appear and disappear quickly and are not correlated with each other. They are most commonly induced by random environmental disturbances.

The goal of the self-test is to detect operational faults, during operation of device 10, that support critical or high availability applications. The self-test may detect fault effects or errors, and controller 52 may take appropriate corrective action. In ADAS, such self-tests help to prevent violation of defined safety goals for GPU 18. For example, the self-test may be used to ensure that a sufficient number of the single point faults or latent faults are detected, such as in accordance with the ASILs described above.

One example way to perform the self-test is for controller 52 to execute slices of the self-test, where each slice is an individual, separable portion of the entire self-test. If the self-test includes a plurality of operations, each slice includes a portion of the operations of the self-test that is separable from the entire self-test. For instance, one slice may be separated such that results generated from the execution of that slice is not necessary for a subsequent slice. As another example, one slice may be separated such that the conclusion of execution of slice results in a logical breaking point of the self-test that is conducive to pausing the self-test. As another example, one slice may be separated such that the operations (e.g., the subset of all operations) of the slice results in a tangible indication of whether a particular set of circuits or memory are operable, where the particular set of circuits is less than all of circuits or memory that need to be ensured as being operating without error. Any combination of these examples of slices is possible including additional example way sin which to determine a slice.

As one example, one slice of self-test may test certain circuitry of GPU 18 and local memory 20. Each slice of the self-test may be selected such as to run within 300 microseconds, as one example.

Also, having slices of self-test provides for configurability for the developer to determine which tests should be run. In some examples, a user may select the tests with an external interface. Furthermore, the tests can be optimized in utilizing the idle time of GPU 18.

While the above example techniques are described with respect to GPU 18, the example techniques are not so limited. Moreover, by using slices for the self-test, the example techniques may be usable for self-test by different components of device 10 including CPU 16 and display interface 26 (e.g., execute self-test when idle). For example, the example techniques may allow for concurrent self-tests on CPU 16 and display interface 26 when CPU 16 or display interface 26 are idle.

Slicing the self-test may also be beneficial for purposes of handling interrupts so that other operations of GPU 18 are not impacted. For example, while GPU 18 is performing a self-test, it may be possible for CPU 16 to issue new instructions to GPU 18 to execute which cause GPU 18 to exit the idle mode. However, the self-test may be utilizing circuit and memory blocks that GPU 18 needs to execute the instructions.

One possibility would be for these instructions to be queued by controller 52, and then when the entire self-test is complete, controller 52 dispatches the queued instructions for execution. However, delaying execution of the instructions until the entire self-test is complete may not be desirable as completion of graphics operations may be delayed, which can impact driver or passenger experience.

By using slices of self-test, controller 52 may pause the execution of the self-test, switch over to executing the received instructions, and then return back to executing slices of the self-test. In some examples, controller 52 may complete the execution of the slice of the self-test, switch over to executing the received instructions, and then return back to execute the next slice. As slices are a portion of the entire self-test, completing the execution of a slice of the self-test may not delay execution of the received instructions in a way that is noticeable to the user. With such interrupt control, GPU 18 may be able to timely complete the execution of instructions received in the middle of executing the self-test.

For example, as illustrated, system memory 30 may store self-test slice 68A-68N (collectively self-test slices 68). Each one of self-test slices 68 may define the portions of GPU 18 and local memory 20 that are to be tested, the operations that are to be performed, or may define the patterns that are to be tested as part of the self-test.

One example way to perform a self-test is for controller 52 to have circuit blocks of GPU 18 and memory blocks of local memory 20 process one or more known inputs 60 using a set of operations, which may be defined by self-test slices 68. Known inputs 60 may be preselected input values that are stored in system memory 30. The result of the operations performed by GPU 18 and local memory 20 may be one or more generated outputs 64 that are stored in system memory 30. Controller 52, or CPU 16, may compare generated outputs 64 to known outputs 62 to determine whether circuit or memory blocks of GPU 18 are operating without error (e.g., determine integrity of circuit or memory blocks of GPU 18). By determining whether circuit or memory blocks of GPU 18 are operating without error, controller 52 and/or CPU 16 may determine whether a sufficient number of faults are detected to be compliant with a safety level (e.g., for ASIL B, at least 90% of single faults were detected). Known outputs 62 are output values that should be the result of processing known inputs 60 based on the operations defined by self-test slices 68.

As an example, the safety mechanism may determine whether correction was needed for a circuit or memory block. Then, by testing circuits and memory blocks of GPU 18 with known inputs 60, and comparing outputs 64 with known outputs 62, CPU 16 and/or controller 52 may confirm that a sufficient number of the faults were detected to be compliant with a specific ASIL. As another example, by testing circuits and memory blocks of GPU 18 with known inputs 60, and comparing outputs 64 with known outputs 62, CPU 16 and/or controller 52 may test the functionality of the safety mechanisms such as the logic of error correction. Such testing of the logic for error correction may ensure that GPU 18 is compliant with the latent fault metrics. Other ways to ensure compliance with the ASILs is possible, and the above example techniques should not be considered limiting.

In one example, controller 52 may start the execution of self-test slice 68A, and may complete the execution of self-test slice 68A (e.g., in 300 microseconds). Next, controller 52 may start the execution of self-test slice 68B, and during the execution of self-test slice 68B, controller 52 may receive instructions to execute. In one example, controller 52 may pause the execution of self-test slice 68B, and may execute the received instructions. Then upon completion of the execution of the received instructions, controller 52 may re-execute self-test slice 68B after controller 52 determines that GPU 18 re-entered the idle mode, and in some examples, re-execute from the beginning of self-test slice 68B. In another example, controller 52 may complete the execution of self-test slice 68B, and then execute the received instructions. Upon completion of the execution of the received instructions and after re-entering idle mode, controller 52 may being the execution of self-test slice 68C, and so forth.

Figure 3:
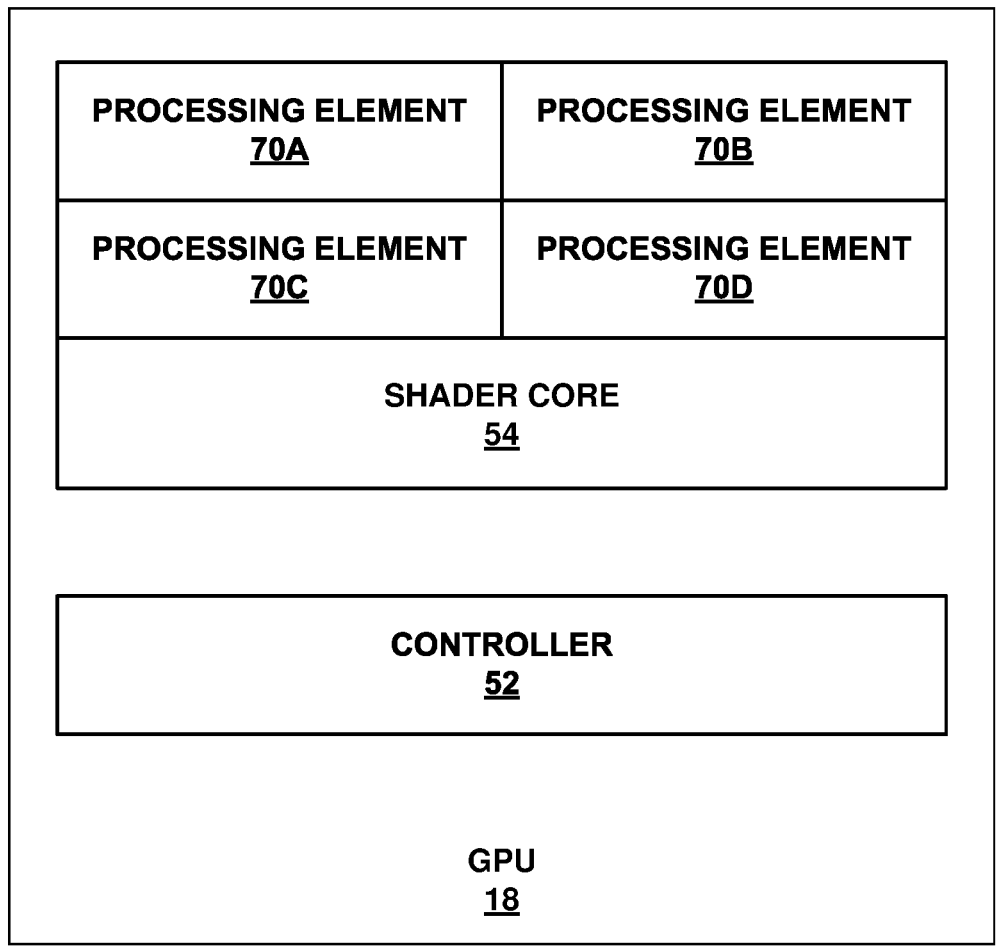
FIG. 3 is a block diagram illustrating circuit blocks of the GPU of FIG. 2 in further detail.

FIG. 3 is a block diagram illustrating circuit blocks of GPU 18 of FIG. 2 in further detail. As illustrated, shader core 54 includes processing elements 70A-70D (collectively processing elements 70). Shader core 54 may include more or fewer processing elements 70 than illustrated.

Processing elements 70 may be hardware components that form a programmable processor or part of shader core 54. In some examples, processing elements 70 may be a single-instruction, multiple-data (SIMD) processing system that is configured to execute a plurality of threads of execution for a program. In such a SIMD system, processing elements 70 may together process a single instruction at a time with respect to different data items. The program may retire after all of the threads associated with the program complete execution.

Controller 52 is configured to control processing elements 70 to execute instructions for a shader object code stored in system memory 30. For each instruction of the program, controller 52 may retrieve the instruction, and process the instruction. In some examples, controller 52 may process the instruction by causing an operation associated with the instruction to execute on one or more of processing elements 70. For example, the instruction retrieved by controller 54 may be an arithmetic instruction that instructs processing elements 70 to perform an arithmetic operation with respect to data items specified by the instruction.

As an example, to perform the self-test, controller 52 may receive one or more of known inputs 60 and operations defined by self-test slice 68A. Controller 52 may instruct one or more of processing elements 70 to perform the operations to generate generated outputs 64 that controller 52 stores in system memory 30. Controller 52 or CPU 16 may compare generated outputs 64 to known outputs 62 to determine whether there are any errors in processing elements 72. In other words, controller 52 or CPU 16 may compare generated outputs 64 to known outputs 62 to determine whether circuit or memory blocks of GPU 18 (where memory block of GPU 18 refers to memory blocks of local memory 29, which is local to GPU 18) are operating without error (e.g., determine integrity of the circuit or memory blocks).

For instance, controller 52 may have determined the ASIL for an application, as indicated in the received information. As described above, the ASIL indicates how many faults in circuits or memory blocks of GPU 18 need to be detected (e.g., at least 90% for ASIL B, 97% for ASIL C, and 99% for ASIL D for the single point faults metric, and at least 60% for ASIL B, 80% for ASIL C, and 90% for ASIL D for latent faults metric). Controller 52 may execute a self-test (e.g., self-test slices 68) to determine integrity of circuit blocks or memory blocks of GPU 18, as indicated by the safety level, in response to GPU 18 entering idle mode. Controller 52 may also confirm whether a sufficient number of the faults were detected based on the determination of the integrity of the circuit blocks or memory blocks of GPU 18. In this way, controller 52 may execute a self-test to determine whether GPU 18 is operating in accordance with the safety level in response to GPU 18 entering idle mode.

As an illustration, assume that the ASIL B is the safety level indicated by the received instructions. ASIL B defines that at least 90% of single point faults should be detected. Accordingly, at least 90% of single point faults in circuits and memory of GPU 18 reserved for safety critical applications need to be detected to be compliant with ASIL B In this example, controller 52 may execute operations defined by self-test slices 68 to test the circuits of processing elements 72 to determine whether the circuits are operating without error. If at least 90% of the faults in circuits of processing elements 72 are detected then controller 52 or CPU 16 may determine that shader core 54 is compliant with ASIL B. To test local memory 20, controller 52 may load known inputs 60 into local memory 20 and store generated outputs 64 in local memory 20 before storing in system memory 30. If 90% of cases where there is corruption in the data of the memory block of local memory 20 is detected, then local memory 20 may be compliant with ASIL B. In this way, controller 52 or CPU 16 may execute a self-test to determine whether faults in circuit or memory blocks of GPU 18 (e.g. such as processing elements 72 and memory block within local memory 20) are detected for compliance with ASIL B.

In some examples, controller 52 may cause the operation to be performed on a particular subset of processing elements 70 by one or both of activating a particular subset of processing elements 70 upon which the operation should be performed and deactivating another subset of processing elements 70 upon which the operation should not be performed. Control unit 12 may activate and/or deactivate processing elements 70 by providing respective activation and/or deactivation signals to each of processing elements 70.

Each of processing elements 70 may be configured to perform operations to assist in processing instructions for a shader. In some examples, each of processing elements 70 may be configured to perform the same set of operations. For example, each of processing elements 70 may implement the same instruction set architecture (ISA). In additional examples, each of processing elements 70 may be an arithmetic logic unit (ALU). In further examples, each of processing elements 70 may be a processing element within the vector processor. In additional examples, processing elements 70 may be a SIMD processing element within the SIMD execution unit.

The operations performed by processing elements 70 may include arithmetic operations, logic operations, comparison operations, etc. Arithmetic operations may include operations such as, e.g., an addition operation, a subtraction operation, a multiplication operation, a division operation, etc. The arithmetic operations may also include, e.g., integer arithmetic operations and/or floating-point arithmetic operations. The logic operations may include operations, such as, e.g., a bit-wise AND operation, a bit-wise OR operation, a bit-wise XOR operation, etc. The comparison operations may include operations, such as, e.g., a greater than operation, a less than operation, an equal to zero operation, a not equal to zero operation, etc. The greater than and less than operations may determine whether a first data item is greater than or less than a second data item. The equal to zero and not equal to zero operations may determine whether a data item is equal to zero or not equal to zero.

In this manner, the example techniques described in this disclosure provide for the ability to detect permanent faults and intermittent faults in GPU 18. Such detection may achieve hardware architectural metrics as per ISO 26262 functional safety standard for single point fault metric (SPFM) and latent point fault metric (LPFM), as called latent fault metric (LFM). The example techniques allow for scaling from ASIL A to ASIL D with minimal impact on the die area of GPU 18.

Figure 4:
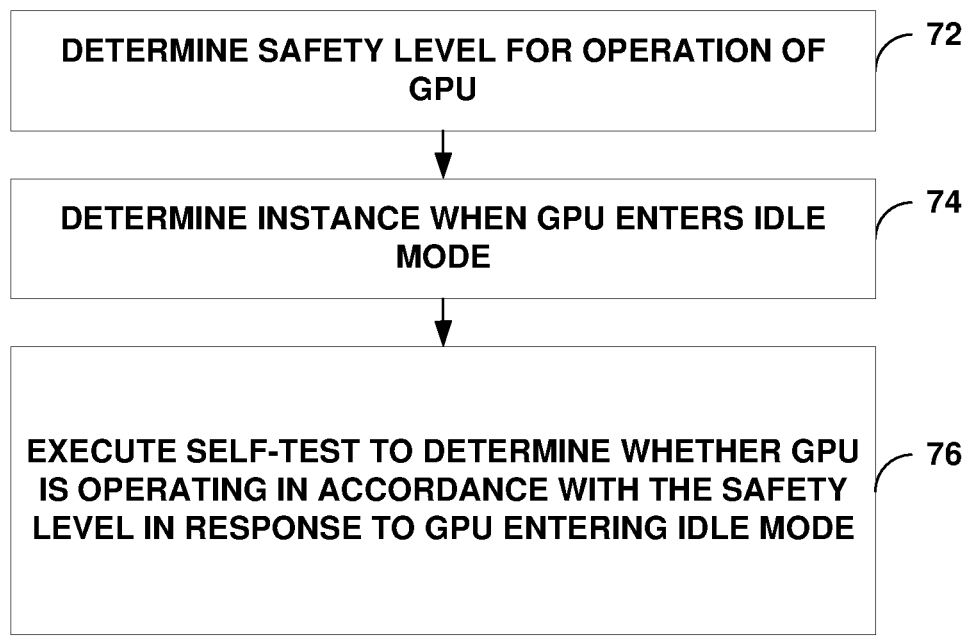
FIG. 4 is a flowchart illustrating an example method of operation according to one or more example techniques described in this disclosure.

FIG. 4 is a flowchart illustrating an example method of operation according to one or more example techniques described in this disclosure. For purposes of description, the examples are described with respect to one or more processing circuits, examples of which include CPU 16 and/or GPU 18, and information stored in memory 30.

GPU 18 may determine a safety level for operation of GPU 18 (72). For example, GPU 18 may receive instructions that indicate the safety level. There may be other ways in which to determine the safety level for operation of GPU 18 in addition to or instead of receiving instructions.

The safety level indicates how many faults in circuits or memory blocks of GPU 18 need to be detected. For example, to operate in accordance with ASIL B, at least 90% of single point faults in circuit and memory blocks for safety critical applications should be detected and at least 60% of latent faults in circuit and memory blocks should be detected to be compliant with the requirements of ASIL B. To operate in accordance with ASIL C, at least 97% of single point faults in circuit and memory blocks for safety critical applications should be detected and at least 80% of latent faults in circuit and memory blocks for safety critical applications should be detected to be compliant with the requirements of ASIL C. To operate in accordance with ASIL D, at least 99% of single point faults in circuit and memory blocks for safety critical applications should be detected and at least 90% of latent faults in circuit and memory blocks for safety critical applications should be detected to be compliant with the requirements of ASIL D.

GPU 18 may determine an instance when GPU 18 enters an idle mode (74). For example, GPU 18 may determine an instance when GPU 18 enters an idle mode based on one or more of instructions in queue that need executing, clock frequency of GPU 18, or instructions from CPU 16 as a few examples.

GPU 18 may execute a self-test to determine whether GPU 18 is operating in accordance with the safety level in response to GPU 18 entering the idle mode (76). For example, GPU 18 may use known inputs 60 as inputs for the self-test slices 68A through 68N to generate outputs 64. CPU 16 or GPU 18 may compare the generated outputs 64 to known outputs 62 to determine whether faults in circuit or memory blocks of GPU 18, are detected as indicated by the safety level (e.g., 99%, 90%, 80% etc.) in accordance with the safety level (e.g., ASIL D, C, B etc.) in response to GPU 18 entering the idle mode.

Figure 5:
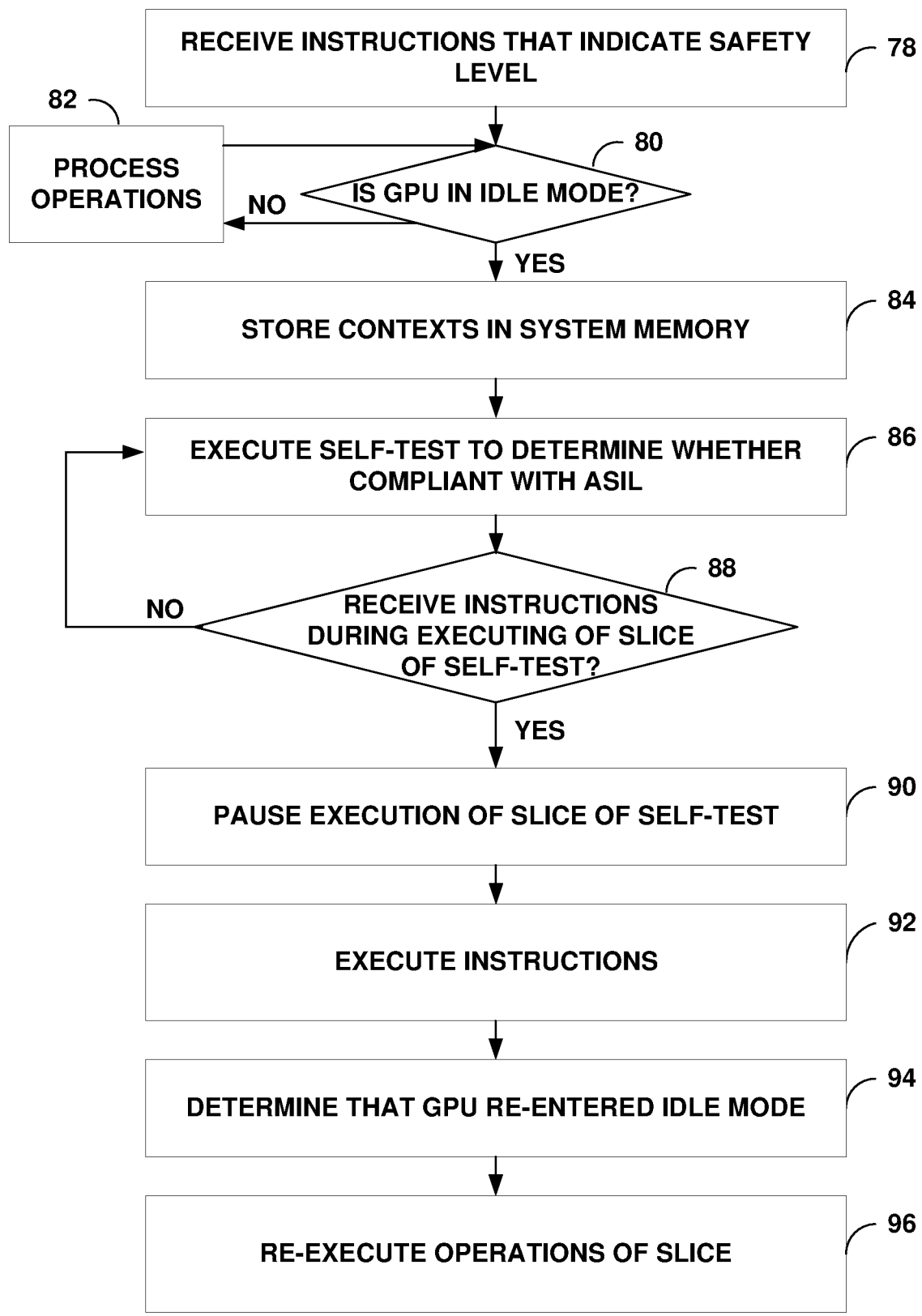
FIG. 5 is a flowchart illustrating another example method of operation according to one or more example techniques described in this disclosure.

FIG. 5 is a flowchart illustrating another example method of operation according to one or more example techniques described in this disclosure. For purposes of description, the examples are described with respect to one or more processing circuits, examples of which include CPU 16 and/or GPU 18, and information stored in memory 30.

GPU 18 may receive instructions that indicate a safety level, where the safety level indicates how many faults in circuits or memory blocks of GPU 18 need to be detected (78). As one example, GPU 18 may receive instructions indicating the safety level as part of the instructions that GPU 18 receives for executing a shader. For instance, the developer may include ASIL information in application 44, and may also indicate a safety level (e.g., ASIL) for application 44 or a portion of application 44 that includes a callout to a shader that GPU 18 is to execute. During the compiling of the source code of the shader, compiler 66 may include an FS flag that indicates that application 44 or portions of application 44 is safety-critical, and includes a two-bit value indicating the ASIL. As described above, each ASIL indicates how many circuit or memory blocks of GPU 18 need to be ensured as operating normally or correctly (e.g., without error such as without single point fault or latent fault, where error is permanent, intermittent, or transient). Controller 52 may receive and process the information indicating the safety level. In some examples, the information indicating the safety level may be based on an ISA, where the ISA is the same for safety and non-safety critical applications.

Controller 52 may determine an instance when GPU 18 enters an idle mode (78). As one example, controller 52 may determine whether there are instructions in the instruction buffer of local memory 20 to determine an instance when GPU 18 enters an idle mode. As another example, controller 52 may determine that the clock rate of GPU 18 has dropped below a threshold to determine an instance when GPU 18 enters idle mode. There may be other ways in which to determine instances when GPU 18 enters the idle mode, and the above are a few examples.

If GPU 18 is not in the idle mode (NO of 80), then GPU 18 may process operations (82). For example, controller 52 may cause processing elements 70 to process instructions and perform the operations that are present in the instruction buffer. In other words, when GPU 18 is not in the idle mode, GPU 18 may operate based on instructions provided by CPU 16.

If GPU 18 enters the idle mode (YES of 80), prior to executing a self-test, GPU 18 may store, with hardwired circuitry, context, also called state information, of GPU 18 into system memory 30 (84). For example, context save and restore circuit 58 may be configured to store values of internal registers, depth buffer, instruction buffer, frame buffer, and the like into system memory 30. In some examples, context save and restore circuit 58 may store context without any instructions from another processing circuit like CPU 16 for storing context of GPU 18. In this way, CPU 16 may not execute a context saving application that saves context of GPU 18, and allows GPU 18 to perform the self-test independently.

Controller 52 may execute the self-test to determine whether GPU 18 is operating in accordance with an ASIL (e.g., safety level) in response to GPU 18 entering the idle mode (86). As one example, controller 52 may parse the information indicating the safety level, and based on the information determine how many faults of circuit and memory blocks need to be detected. To perform the self-test, controller 52 may utilize known inputs 60 as inputs for processing elements 70. Controller 52 may start with self-test slice 68A and cause one or more processing elements 70 to perform the operations defined by self-test slice 68A, which may define specific operations as well as which ones of one or more known inputs 60 to use. The result of the operations defined by self-test slice 68A may be one or more of generated outputs 64.

Controller 52 or CPU 16 may compare one or more of generated outputs 64 with one or more of known outputs 62 to determine whether the outputs are the same. Based on the comparison, controller 52 or CPU 16 may determine whether a sufficient number of the faults were detected, as defined by the specified ASIL.

Controller 52 may not execute the self-test every instance that GPU 18 enters the idle mode. Rather, controller 52 may selectively execute the self-test based on defined safety level, or various other factors such as length of time GPU 18 was in idle mode the last few instances that GPU 18 entered idle mode.

In this manner, GPU 18 may perform an in-run self-test during operation of the automobile. For instance, GPU 18 may be configured to generate image content for an automotive application while an automobile is in operation. The safety level is part of the ASIL, and GPU 18 may execute the self-test during operation of the automobile.

Moreover, in one or more example techniques, GPU 18 may be configured to perform the self-test independent of any instructions from another processing circuit instructing GPU 18 to perform the self-test (e.g., automatically perform the self-test without instructions from another processing circuit instructing GPU 18 to perform the self-test). For instance, from the perspective of CPU 16, GPU 18 may be operating as normal, and CPU 16 does not instruct GPU 18 about when to perform the self-test or provide instructions instructing GPU 18 to perform the self-test. Rather, GPU 18 may independently perform the self-test when determined of an instance when GPU 18 enters the idle mode.

Controller 52 may determine whether instructions are received that cause GPU 18 to exit the idle mode while executing operations of a slice of the self-test (88) (e.g., based on whether there are new instructions in the instruction buffer with a corresponding register value indicating that there are new instructions in the instruction buffer). If new instructions are not received (NO of 88), then controller 52 may continue with the self-test and complete execution of the slice of the self-test, and proceed with the next slice, and so forth (86).

If new instructions are received (YES of 88), then controller 52 may pause execution of the slice of the self-test (90). Controller 52 may then cause shader core 54 to execute the one or more instructions (92). After the completion of the execution of the instructions, controller 52 may determine that GPU 18 re-entered the idle mode (94). After GPU 18 re-enters the idle mode, controller 52 may re-execute the operations of the slice of the self-test that GPU 18 was executing when interrupted with the new instructions (96).

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media. In this manner, computer-readable media generally may correspond to tangible computer-readable storage media which is non-transitory. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. It should be understood that computer-readable storage media and data storage media do not include carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some examples, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A system for self-test of a graphics processing unit (GPU), the system comprising:
   a memory configured to store data; and
   one or more processors comprising the GPU, the one or more processors configured to:
     generate, with a compiler, instructions for the GPU to indicate a safety level based on an instruction set architecture (ISA), wherein the ISA is the same for a safety critical application and a non-safety critical application;
     determine, by the GPU, the safety level for operation of the GPU; and
     execute a self-test to determine whether the GPU is operating in accordance with the safety level.

2. The system of claim 1, wherein the safety critical application and the non-safety critical application are run on the same System on Chip (SoC).

3. The system of claim 1, wherein the safety level is based on a number of faults in circuits or memory blocks of the GPU that need to be detected.

4. The system of claim 1, wherein the one or more processors are further configured to:
determine an instance when the GPU enters an idle mode, wherein executing the self-test to determine whether the GPU is operating in accordance with the safety level is in response to the GPU entering the idle mode.

5. The system of claim 4, wherein executing the self-test comprises executing operations of a plurality of slices of the self-test, each slice comprising a portion of operations of the self-test, wherein the one or more processors are further configured to:
receive one or more instructions that cause the GPU to exit the idle mode while executing operations of a slice of the plurality of slices;
pause the execution of the slice of the self-test; and
execute the one or more instructions.

6. The system of claim 5, wherein the one or more processors are further configured to:
determine that the GPU re-entered the idle mode after completion of execution of the one or more instructions; and
re-execute the operations of the slice in response to the GPU re-entering the idle mode.

7. The system of claim 1, wherein to execute the self-test the one or more processors are further configured to execute the self-test to determine whether the GPU is operating in accordance with the safety level in response to the GPU entering the idle mode and independent of any instructions from another processing circuit instructing the GPU to perform the self-test.

8. The system of claim 1, wherein the GPU is further configured to generate image content for an automobile application while an automobile is in operation, wherein the safety level is part of the automotive safety integrity level (ASIL), and wherein executing the self-test comprises executing the self-test during operation of the automobile.

9. The system of claim 8, wherein the safety critical application and the non-safety critical application are each associated with a complier flag that identifies an ASIL of the associated application.

10. The system of claim 8, wherein the automobile application is a safety critical application corresponding to an Advanced Driver Assistance System (ADAS).

11. The system of claim 1, wherein the one or more processors are further configured to:
prior to executing the self-test, store, with hardwired circuitry of the GPU, context of the GPU into system memory independent of any instructions from another processing circuit for storing context of the GPU.

12. A method for self-test of a graphics processing unit (GPU), the method comprising:
generating, with a compiler, instructions for the GPU to indicate a safety level based on an instruction set architecture (ISA), wherein the ISA is the same for a safety critical application and a non-safety critical application;
determining, by the GPU, the safety level for operation of the GPU; and
executing a self-test to determine whether the GPU is operating in accordance with the safety level.

13. The method of claim 12, wherein the safety critical application and the non-safety critical application are run on the same System on Chip (SoC).

14. The method of claim 12, wherein the safety level is based on a number of faults in circuits or memory blocks of the GPU that need to be detected.

15. The method of claim 12, further comprising:
determining an instance when the GPU enters an idle mode, wherein executing the self-test to determine whether the GPU is operating in accordance with the safety level is in response to the GPU entering the idle mode.

16. The method of claim 15, wherein executing the self-test comprises executing operations of a plurality of slices of the self-test, each slice comprising a portion of operations of the self-test, the method further comprising:
receiving one or more instructions that cause the GPU to exit the idle mode while executing operations of a slice of the plurality of slices;
pausing the execution of the slice of the self-test; and
executing the one or more instructions.

17. The method of claim 16, further comprising:
determining that the GPU re-entered the idle mode after completion of execution of the one or more instructions; and
re-executing the operations of the slice in response to the GPU re-entering the idle mode.

18. The method of claim 12, wherein executing the self-test comprises executing the self-test to determine whether the GPU is operating in accordance with the safety level in response to the GPU entering the idle mode and independent of any instructions from another processing circuit instructing the GPU to perform the self-test.

19. The method of claim 12, wherein the GPU is configured to generate image content for an automobile application while an automobile is in operation, wherein the safety level is part of the automotive safety integrity level (ASIL), and wherein executing the self-test comprises executing the self-test during operation of the automobile.

20. The method of claim 19, wherein the safety critical application and the non-safety critical application are each associated with a complier flag that identifies an ASIL of the associated application.

21. The method of claim 19, wherein the automobile application is a safety critical application corresponding to an Advanced Driver Assistance System (ADAS).

22. The method of claim 12, further comprising:
prior to executing the self-test, storing, with hardwired circuitry of the GPU, context of the GPU into system memory independent of any instructions from another processing circuit for storing context of the GPU.

23. A non-transitory computer-readable storage medium having instructions for self-testing a graphics processing unit (GPU) stored thereon that, when executed, cause a computing device to:
generate, with a compiler, instructions for the GPU to indicate a safety level based on an instruction set architecture (ISA), wherein the ISA is the same for a safety critical application and a non-safety critical application;
determine, by the GPU, the safety level for operation of the GPU; and
execute a self-test to determine whether the GPU is operating in accordance with the safety level.

* * * * *